United States Patent [19]

McDougall

[11] Patent Number: 5,084,677
[45] Date of Patent: Jan. 28, 1992

[54] MAGNETIC FIELD GENERATING APPARATUS

[75] Inventor: Ian L. McDougall, Oxfordshire, England

[73] Assignees: Oxford Medical Limited, Oxford, United Kingdom; E. I. Du Pont de Nemours and Company, Wilmington, Del.

[21] Appl. No.: 531,142

[22] Filed: May 31, 1990

[30] Foreign Application Priority Data

Jun. 1, 1989 [GB] United Kingdom ............... 8912601

[51] Int. Cl.5 ............................................. G01R 33/20
[52] U.S. Cl. ..................................... 324/320; 324/322
[58] Field of Search ...................... 324/309, 320, 322

[56] References Cited

U.S. PATENT DOCUMENTS

| | | | |
|---|---|---|---|
| 4,710,741 | 1/1987 | McGinley | 324/320 |
| 4,721,914 | 1/1988 | Fukushima | 324/320 |
| 4,737,717 | 4/1988 | Petro | 384/320 |
| 4,771,243 | 9/1988 | Vreugdenhill et al. | 324/320 |
| 4,853,663 | 8/1989 | Vesmilyea | 324/320 |

FOREIGN PATENT DOCUMENTS

| | | |
|---|---|---|
| 0138270 | 4/1985 | European Pat. Off. |
| 0160350 | 11/1985 | European Pat. Off. |
| 0167243 | 1/1986 | European Pat. Off. |
| 0186998 | 7/1986 | European Pat. Off. |
| 0187691 | 7/1986 | European Pat. Off. |
| 2207762 | 2/1989 | United Kingdom |

OTHER PUBLICATIONS

Product Development, Oct. 1985 Diagnostic Imaging, pp. 134, 135, 138 and 139.

Primary Examiner—Michael J. Tokar
Attorney, Agent, or Firm—Staas & Halsey

[57] ABSTRACT

Magnetic field generating apparatus for example for use in a nuclear magnetic resonance system comprises a first set of coils for generating a first magnetic field in a working volume outside the volume defined by the coils. A separate, second coil is provided spaced from the first set of coils for generating a second magnetic field in the working volume. The arrangement is such that the resultant magnetic field in the working volume is substantially homogeneous. An active shield coil may optionally be provided around the first set of coil.

7 Claims, 1 Drawing Sheet

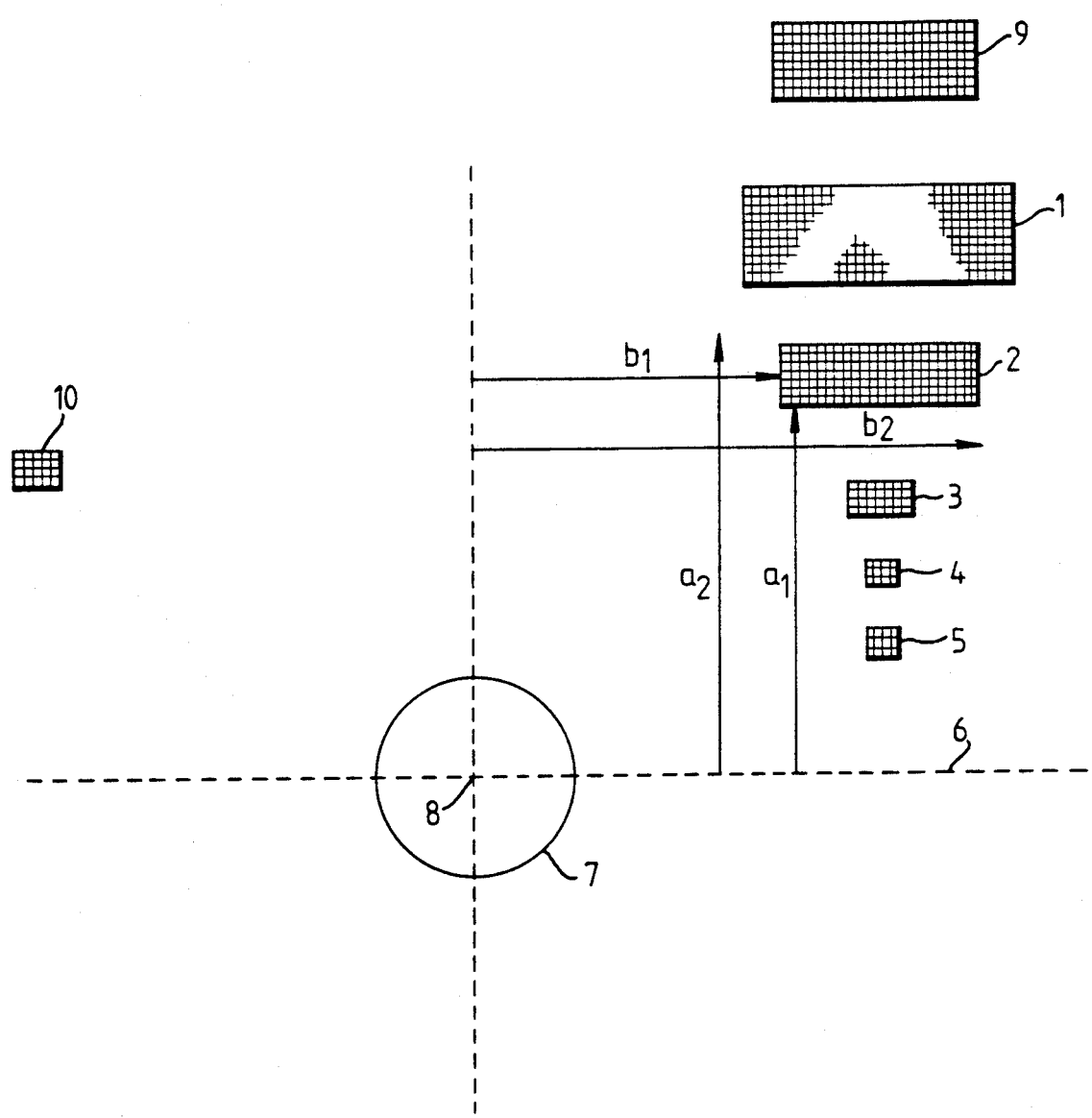

5,084,677

MAGNETIC FIELD GENERATING APPARATUS

FIELD OF THE INVENTION

The invention relates to magnetic field generating apparatus, for example for generating a substantially homogeneous magnetic field within a working volume to enable a nuclear magnetic resonance (NMR) experiment to be carried out.

DESCRIPTION OF THE PRIOR ART

One of the problems with conventional magnetic field generating apparatus for use in performing NMR experiments is the fact that the working volume has traditionally been generated at the center of the apparatus making the volume relatively inaccessible. More recently, various proposals have been made for projecting the homogeneous working volume outside the magnetic field generating apparatus. An example of such a system is described in EP-A-0160350 which illustrates a nest of coils which are so arranged that the homogeneous volume can be projected beyond the volume of the apparatus itself.

Although the system described in EP-A-0160350 is generally acceptable and works well, it leads to a fairly expensive construction since typically the coils are made of superconducting material and a large amount of such material is required relative to the magnitude of the field within the working volume.

Another system for projecting the homogeneous working volume outside the apparatus is described in EP-0186998. Again this suffers from problems of expense.

SUMMARY OF THE INVENTION

In accordance with the present invention, magnetic field generating apparatus comprises first magnetic field generating means for generating a first magnetic field in a working volume outside the volume defined by the first magnetic field generating means; and separate, second magnetic field generating means spaced from the first magnetic field generating means for generating a second magnetic field in the working volume, the arrangement being such that the resultant magnetic field in the working volume is substantially homogeneous.

We have found that where the first magnetic field generating means generates the main field in the working volume, providing one or more separate or auxiliary sources of magnetic field spaced from the first magnetic field generating means enables a considerable reduction in the size of the first magnetic field generating means for a given magnetic field and uniformity to be achieved. This is particularly significant where the first magnetic field generating means comprises a superconducting material, such as one or more electrical coils. Furthermore, the first and second magnetic field generating means may be sufficiently spaced to allow access to the working volume in a direction transverse to the direction in which the first and second magnetic field generating means are spaced apart.

The first magnetic field generating means may be made from any suitable material, for example a resistive or superconducting material and in the case of superconducting materials these may comprise traditional low temperature superconductors or the more recently developed high temperature superconductors. Typically, the first magnetic field generating means will be in the form of a set of electrical coils which are preferably coaxial. The coils may carry currents in the same sense or it may be appropriate for at least one of the coils to carry a current in the opposite sense to the remaining coils. The choice of coil size and relative spacing as well as current direction is chosen empirically so as to balance as far as possible the higher order field terms in order to improve the homogeneity of the first magnetic field in the working volume. However, as has been explained above, due to the presence of the second magnetic field generating means, it is not necessary for the first magnetic field generating means to generate by itself a highly homogeneous field since a relatively inhomogeneous field can be homogenised to an acceptable level by the second magnetic field generating means.

The degree of homogeneity achieved within the working volume is also chosen empirically depending upon the experiment which is to be performed. Typically, for a nuclear magnetic resonance experiment, for example NMR imaging or spectroscopy, homogeneities in the order of a few ppm e.g. ±10 ppm on a 15 cm diameter sphere are appropriate.

Preferably, the external dimension (diameter in the case of coils) of the second magnetic field generating means should be less than the external dimension of the first magnetic field generating means, most preferably, less than ½ the external dimension of the first magnetic field generating means.

The second magnetic field generating means may comprise a permanent magnet, a high temperature superconductor or an electrical coil (superconducting or non-superconducting). Furthermore, the second magnetic field generating means need not be of the same type as the first magnetic field generating means.

The apparatus will generally produce a high fringe field which will need to be shielded in some manner. Conventional iron shielding can be used but preferably the first magnetic field generating means is "actively shielded" by providing at least one further magnetic field generator to counteract the fringe field generated by the first magnetic field generating means but without substantially affecting the homogeneity of the field within the working volume. Indeed, by suitably arranging this additional shielding magnetic field generator, it can positively contribute to improving the homogeneity of the magnetic field within the working volume. Preferably, where the first magnetic field generating means comprises a set of electrical coils, the active shield is provided by an auxiliary coil or coils, typically connected in series with the set of coils. Alternatively, the auxiliary coil could be made of high temperature superconductor to minimize difficulties with cryogen in large volumes.

The invention can be applied in a wide variety of fields including not only whole body, body parts, and animal nuclear magnetic resonance imaging but also other industrial and commercial applications involving the identification, characterization, measurement, quality assurance and control of materials, components, and assemblies. While not intended to be exhaustive, some specific examples of these applications could be identification of drugs or explosives, characterization of green body ceramics, measurement of oil saturation and permeability in drilled cores, quality assurance in polymer and ceramic processing, and quality control in foodstuffs or laminate or fiber composites.

BRIEF DESCRIPTION OF THE DRAWING

An example of human body NMR imaging apparatus in accordance with the invention will now be described with reference to the accompanying drawing which is a diagrammatic view of the apparatus.

DETAILED DESCRIPTION OF THE EMBODIMENTS

The apparatus shown in the drawing comprises a set of five, superconducting, electrical coils 1-5 positioned coaxially about an axis 6. Only one half of each coil is shown in the drawing. The coils 1-5 constitute a first magnetic field generating assembly. This assembly generates a magnetic field within its bore but also extending through a working region 7 spaced from the assembly and centred at an origin 8.

Surrounding the assembly formed by the coils 1-5 is an optional shielding coil 9 formed of superconducting material connected in series with the coils 1-5 which are themselves connected in series. The coils 1-5, 9 are housed in a cryostat (not shown) in a conventional manner.

An auxiliary coil 10 is positioned on the opposite side of the working volume 7 from the other coils and generates an auxiliary magnetic field within the working volume 7. It will be noted that the coil 10 is coaxial with the axis 6 although this is not necessarily essential.

In practice, the main assembly defined by the coils 1-5 (and 9 if provided) can be positioned vertically parallel with the wall of a building so that the patient lies across its diameter or, if the diameter can be made small enough, it may be laid flat on the floor so that the patient lies on top of the magnet. The first arrangement is generally preferred since the auxiliary coil 10 or "SHADE" magnet can be relatively easily positioned at an appropriate place.

The effect of the coil 10 is to reduce the first order gradient across the working volume or homogeneous zone 7 so reducing the "push pull" reaction between the outermost coil 1 and the next coil 2 radially inward which otherwise has to achieve cancellation of most of the first order gradients.

Within a given outside diameter, there are a range of inner coil spacings that provide reasonable economic performance, judged as conductor quantity per unit of homogeneity. However, the solutions for the best overall performance will be those that tend to maximize the separation between coils so that peak fields are kept fairly low i.e. 1.5 to 3.0T.

The most efficient use of conductor is obtained by maximizing the separation between the active shield coil 9 and the largest positive running coil 1 of the coil array. Because the patient does not pass through the origin of the coil array, it is possible to put a cancellation coil 9 on the end of the magnet.

Table 1 below illustrates two configurations of the coils shown in the drawing for producing a homogeneous region within a 15 cm diameter sphere defining the working volume 7. The distances $a_1$, $a_2$, $b_1$ and $b_2$ are shown in the drawing as they relate to the coil 2 and define the position of the coils relative to the origin 8. All distances are in centimeters. The degree of homogeneity is given in the Table.

The significant advantage of the invention can be seen from a review of Table 2 below. Section I defines a magnet system comprising solely the coils 1-5 which produce a homogeneous field ($B_0$) within a working region 7 but require 66297 meters of superconductor.

Section II of Table 2 illustrates a system similar to that shown in Section I of the Table but with the addition of a coil 10 positioned as shown in the Table. It will be seen that this additional coil 10 allows the total length of superconductor to be more than halved.

Table 3 below compares various properties of different coil systems. In all these systems, the main magnet assembly comprises six coils (instead of the five shown in FIG. 1) with an additional coil similar to the coil 10 which is referred to as the "SHADE". For most of the coil systems, a comparison is made between an unshielded system (Ex AS) and one provided with an active shielding coil (AS) similar to the coil 9 of FIG. 1. In all these cases the main field within the working volume 7 is 0.2T. Table 3 indicates in each case the total length of conductor required (Km) and the position of the 5 gauss line both radially (Rm) and axially (Am).

The number of turns, direction of current flow, and positions of the coils 1-5, 9, and 10 are all selected empirically so that the resultant magnetic field within the working volume 7 is substantially homogeneous while the effect of the coil 9 is to actively shield the fringe magnetic field. Various methods can be used to determine coil parameters. A typical method is described in EP-A-0160350. This particular method of optimization will give the sign and magnitude of the ampere turns for each coil against the target working field and the sum of each error term, these latter usually being set equal to zero to obtain the best field uniformity. For a given current in the case of coils connected in series, the turns in each coil derived may not always be economic or even practical. Therefore, the optimization procedure is repeated many times using a formal sequence of position moves for the coils. Using a computer we may seek to minimize the total ampere turns for the coil array. There are many possible sequences but a simple example might be the following:

| Coil Nos. | 1 | 2 | 3 | Optimise |
|---|---|---|---|---|
| A. Select arbitary coil positions within space envelope of interest | | | | |
| Radial origin | $a_1$ | $a_2$ | $a_3$ | $(\Sigma NI)_0$ |
| Axial origin | $b_1$ | $b_2$ | $b_3$ | |
| B. Select a or b moves; say a | | | | |
| 1st move $a_1$ search step | | | | |
| | $a_1 + \Delta a_1$ | $a_2$ | $a_3$ | $(\Sigma NI)_1$ |
| Test | $(\Sigma NI)_1 < (\Sigma NI)_0$ | | | |
| C. 2nd move if yes | | | | |
| | $a_1 + 2\Delta a_1$ | $a_2$ | $a_3$ | $(\Sigma NI)_2$ |
| if no | | | | |
| | $a_1 - \Delta a_1$ | $a_2$ | $a_3$ | $(\Sigma NI)_2$ |
| Test | $(\Sigma NI)_2 < (\Sigma NI)_1$ | | | |

Continue to move in direction $\pm a_1$ until no further reduction in $(\Sigma NI)$ is achieved. Various gauges can be added, e.g. how fast is $\Sigma NI$ reducing: Have we reached a physical boundary.

Then the whole sequence is repeated moving coil number two in steps of $\Delta a_2$, using the position of coil number one that gave least value of ampere turns.

TABLE 1

| Coil # | $a_1$ | $a_2$ | $b_1$ | $b_2$ | $t\ cm^{-2}$ | No. turns | Amperes | Length m |
|---|---|---|---|---|---|---|---|---|
| Example 1 | | | | | | | | |
| 1 | 123.61 | 144.39 | 29.61 | 50.39 | 10 | 4317 | 200 | 36352 |
| 2 | 54.99 | 65.01 | 34.99 | 45.01 | 10 | 1002 | −200 | 3780 |
| 3 | 38.68 | 41.32 | 38.68 | 41.32 | 100 | 692 | 200 | 1740 |
| 4 | 29.08 | 30.92 | 39.08 | 40.92 | 100 | 336 | −200 | 634 |
| 5 | 16.60 | 17.40 | 39.60 | 40.40 | 100 | 64 | 200 | 68 |
| 10 | 46.27 | 47.73 | −50.73 | −49.27 | 100 | 214 | 200 | 632 |
| 9 | 163.88 | 176.12 | 33.88 | 46.12 | 100 | 1500 | −200 | 16022 |
| | | | | | | | | 59228 m |
| Example 2 | | | | | | | | |
| Field Bo 2000 Gauss. Residue 0.0018 G $B_6$ 0.00196 G $B_7$ on 15 cm dsv. | | | | | | | | |
| 1 | 92.84 | 107.16 | 27.84 | 42.16 | 20 | 4106 | 200 | 25818 |
| 2 | 43.01 | 52.99 | 30.01 | 39.99 | 20 | 1991 | −200 | 6000 |
| 3 | 27.67 | 32.33 | 32.67 | 37.33 | 100 | 2170 | 200 | 4104 |
| 4 | 20.49 | 24.51 | 32.99 | 37.01 | 100 | 1619 | −200 | 2253 |
| 5 | 11.37 | 13.63 | 33.87 | 36.13 | 100 | 514 | 200 | 389 |
| 10 | 34.29 | 35.71 | −45.71 −44.30 | 100 | 198 | 200 | 435 | |
| 9 | 165.67 | 174.33 | 35.67 | 44.33 | 20 | 1500 | −200 | 16022 |
| | | | | | | | | 55021 |
| Field Bo 2000 Gauss Residue 0.062 G $B_6$ 0.038 G $B_7$ on 15 cm dsv | | | | | | | | |

TABLE 2

| COIL # | $a_1$ | $a_2$ | $b_1$ | $b_2$ | $t\ cm^{-2}$ | No. Turns | Amperes | Length m |
|---|---|---|---|---|---|---|---|---|
| SECTION I | | | | | | | | |
| 1 | 121.18 | 146.82 | 27.18 | 52.82 | 10 | 6572 | 200 | 41293 |
| 2 | 76.24 | 93.77 | 21.24 | 38.77 | 10 | 3072 | −200 | 19308 |
| 3 | 38.86 | 41.14 | 28.86 | 31.14 | 100 | 518 | 200 | 3260 |
| 4 | 29.08 | 30.92 | 29.08 | 30.92 | 100 | 337 | −200 | 2118 |
| 5 | 19.64 | 20.36 | 29.64 | 30.36 | 100 | 51 | 200 | 318 |
| | | | | | | | | 66297 m |
| Field Bo 2000 Gauss residue 0.108 G $B_5$ 0.034 B $G_6$ | | | | | | | | |
| SECTION II | | | | | | | | |
| 1 | 125.45 | 142.56 | 31.45 | 48.56 | 10 | 2925 | 200 | 24627 |
| 2 | 55.5 | 64.48 | 35.52 | 44.48 | 10 | 801 | −200 | 3022 |
| 3 | 38.83 | 41.17 | 38.83 | 41.17 | 100 | 546 | 200 | 1373 |
| 4 | 29.19 | 30.81 | 39.19 | 40.81 | 100 | 261 | −200 | 493 |
| 5 | 16.65 | 17.55 | 39.65 | 40.35 | 100 | 249 | 200 | 87 |
| 10 | 46.31 | 47.69 | −50.69 | −49.31 | 100 | 192 | 200 | 567 |
| | | | | | | | | 30,169 m |
| Field Bo 2000 Gauss residue 0.001 G $B_6$ 0−.0015 G $B_7$ | | | | | | | | |

TABLE 3

| OUTER COIL DIA CM | | NOS COILS | RESIDUE ERROR ON 15 cm DSV PPM | PROJECTION FROM PLANE OF COIL cm | AMEPRE TURNS TOTAL | | CONDUCTOR LENGTH Km TOTAL | | FRINGE FIELD 5 G | |
|---|---|---|---|---|---|---|---|---|---|---|
| Ex AS | AS | | | | Ex AS | AS | Ex AS | AS | Rm | Am |
| 268 | — | 6 + SHADE | 2 | 40 | 916,700 | — | 29 | — | — | — |
| 268 | 340 | 6 + SHADE | 2 | 40 | 1,282,685 | 300,000 | 42 | 16 | 7 | 6 |
| 240 | — | 6 + SHADE | 3 | 35 | 788,401 | — | 23 | — | | |
| 240 | 340 | 6 + SHADE | 3 | 35 | 1,121,787 | 300,000 | 34 | 16 | 5 | +7 −5 |
| 220 | 340 | 6 + SHADE | 12 | 35 | 1,346,101 | 300,000 | 37 | 16 | — | — |
| 200 | — | 6 + SHADE | 50 | 35 | 1,245,039 | — | 28 | — | 7 | +9 −9 |
| 200 | 340 | 6 + SHADE | 50 | 35 | 2,726,951 | 300,000 | 44 | 16 | 5.5 | +3.5 −3.5 |

I claim:

1. Magnetic field generating apparatus for generating a substantially homogeneous magnetic field in a working volume, comprising:

first magnetic field generating means, defining a volume surrounding said first magnetic field generating means, for generating a first magnetic field in the working volume, wherein the working volume is outside the volume defined by the first magnetic field generating means; and second magnetic field generating means, separate and spaced from said first magnetic field generating means, for generating a second magnetic field in said working volume, wherein said working volume is positioned between and spaced from said first and second magnetic field generating means such that a resultant magnetic field in said working volume, resulting from said first magnetic field and said second magnetic field, is substantially homogeneous.

2. Apparatus according to claim 1, wherein said first magnetic field generating means comprises at least one superconducting electrical coils.

3. Apparatus according to claim 2, wherein said coils are coaxial.

4. Apparatus according to claim 1, wherein said second magnetic field generating means comprises a permanent magnet.

5. Apparatus according to any of the preceding claim 1, wherein the external dimension of said second magnetic field generating means is less than the external dimension of said first magnetic field generating means.

6. Apparatus according to claim 5, wherein the external dimension of said second magnetic field generating means is less than one third said external dimension of said first magnetic field generating means.

7. Nuclear magnetic resonance apparatus including a magnetic field generating apparatus for generating a substantially homogeneous magnetic field in a working volume, comprising:

first magnetic field generating means, defining a volume surrounding said first magnetic field generating means, for generating a first magnetic field in the working volume, wherein the working volume is outside the volume defined by the first magnetic field generating means; and second magnetic field generating means, separate and spaced from said first magnetic field generating means, for generating a second magnetic field in said working volume, wherein said working volume is positioned between and spaced from said first and second magnetic field generating means such that a resultant magnetic field in said working volume, resulting from said first magnetic field and said second magnetic field, is substantially homogeneous.

* * * * *